United States Patent [19]

Seong

[11] Patent Number: 5,200,826
[45] Date of Patent: Apr. 6, 1993

[54] TV SIGNAL RECEIVING DOUBLE CONVERSION TELEVISION TUNER SYSTEM HAVING AUTOMATIC GAIN CONTROL PROVISIONS

[75] Inventor: Chang-yeol Seong, Seoul, Rep. of Korea

[73] Assignee: Samsung Electronics Co., Ltd., Suwon, Rep. of Korea

[21] Appl. No.: 701,760

[22] Filed: May 17, 1991

[30] Foreign Application Priority Data

Jun. 21, 1990 [KR] Rep. of Korea ............. 90-9152

[51] Int. Cl.$^5$ .................. H04N 5/44; H04B 1/26
[52] U.S. Cl. .................. 358/191.1; 358/195.1; 455/315; 455/316
[58] Field of Search .......... 358/191.1, 195.1; 455/313, 314, 315, 316, 258

[56] References Cited

U.S. PATENT DOCUMENTS

| | | | |
|---|---|---|---|
| 4,340,975 | 7/1982 | Onishi | 358/191.1 |
| 4,581,643 | 8/1986 | Carlson | 358/195.1 |
| 5,010,400 | 4/1991 | Oto | 358/191.1 |
| 5,014,350 | 5/1991 | Nezu | 455/258 |

*Primary Examiner*—Tommy P. Chin
*Attorney, Agent, or Firm*—Robert E. Bushnell

[57] ABSTRACT

A TV signal receiving system, in order to tune a broadcasting frequency of a desired channel after receiving a TV signal, converts the TV signal into an intermediate frequency having a frequency higher than the maximum frequency in a TV broadcasting frequency band and then converts again the frequency of the signal into another intermediate frequency in conventional TV systems so as to improve the rejection characteristics of image and IF signals. The system comprises a first converter for tracking a desired channel frequency from a TV RF signal and converting the frequency into a first IF of 2 GHz, a band-pass filter of the 2 GHz IF for filtering only the first IF frequency signal in the first converter, and a second converter for converting the filtered first IF into 45 MHz of the conventional TV IF.

5 Claims, 2 Drawing Sheets

TV SIGNAL RECEIVING DOUBLE CONVERSION TELEVISION TUNER SYSTEM HAVING AUTOMATIC GAIN CONTROL PROVISIONS

BACKGROUND OF THE INVENTION

The present invention relates to a TV signal receiving system, and more particularly to a TV signal receiving system which, in order to tune a broadcasting frequency of a desired channel after receiving a TV signal, converts the TV signal into an intermediate frequency (hereinafter referred to as IF) higher than the maximum frequency in a TV broadcasting frequency band and then converts again the IF into another IF as high as that of a conventional TV system, thereby improving the rejection characteristics of image and IF components.

A heterodyne intermediate frequency converting system as shown in FIG. 1 is employed in a TV tuner for receiving a radio frequency (hereinafter referred to as RF) signal and selecting a desired channel in a conventional TV or VCR.

Such a tuner system uses variable capacitance diode devices to form an electronic type tuner which has no contact points which conventional mechanical type tuners have, thereby enabling to lengthen the life time of the tuner and to improve functions such as the remote control.

However, the conventional tuner system has a problem that the production cost and the size of the tuner are increased by using a large number of discrete device due to use of various coils because the tuner should be tuned using the characteristic variation and inductance value of the variable capacitance diode so called a varactor.

Furthermore, since an RF signal in 50 MHz to 900 MHz is tuned to a frequency of a desired channel and is directly converted to an IF signal of 45 MHz by using a direct down-conversion method in the conventional system, mixture and interference of an image frequency and IF components occur to deteriorate the tuner.

The characteristic of a conventional heterodyne demodulating system will be described below with reference to FIG. 1.

If an output carrier frequency of RF amplifier 3 is fc, an oscillating frequency of local oscillator 5 is $f_{LO}$, and an output IF frequency of mixer 6 is $f_{IF}$, the output IF frequency of mixer 6 in the heterodyne system becomes $f_{IF} = f_{LO} - fc$. Here, the value of $f_{IF}$ is 45 MHz in the NTSC TV system. At this time, if a frequency of an image component is $f_{IM}$, the following equation is established.

$$f_{IM} = fc \pm 2 f_{IF}$$

If $f_{IF}$ frequency component affecting on the image component interferes in an input terminal, the component acts on a tuned channel signal as an interference signal to deteriorate TV picture quality.

In FIG. 1, reference numerals 2, 4, 7, 8 and 9 denoted in the drawing but undescribed in the specification represent an input tuning portion, an intermediate tuning portion, a band pass filter, an IF amplifier and a demodulator, respectively.

For instance, if a carrier frequency of a station is 150 MHz and an IF is 45 MHz in the existing NTSC system in case of adopting an direct down-conversion system, that is, fc=150 MHz and $f_{IF}$=45 MHz, then an oscillating frequency $f_{LO}$ for RF demodulating the signals in local oscillator 5 is 195 MHz since $f_{LO} = f_{IF} + fc$, and an image frequency $f_{IM}$ is expressed as follows.

$$f_{IM} = fc \pm 2 f_{IF} = 150 \pm 2 \times 45 = 60 \text{ MHz}/240 \text{ MHz}.$$

The signal lies within the band of 50 to 900 MHz, that is, in-band of a TV signal, accordingly causes to be mixed with a signal around other channels to act as an interference signal.

Accordingly, rejection capability of such image components is greatly important in performance of a tuner system.

The reason why the image component exists within a TV band channel to act as an interference signal is that the value of the IF is 45 MHz which is much lower than a TV band. That is, in the conventional system using an IF of 45 MHz, an image frequency exists within ±90 MHz (2×45 MHz) of the TV broadcasting channel frequencies and mostly within the TV broadcasting frequency band.

Its main cause is that a tuned broadcasting signal is directly converted into a low frequency of 45 MHz.

SUMMARY OF THE INVENTION

Therefore, it is an object of the present invention to provide a TV signal receiving method which promotes rejection characteristic of an image and IF components by adopting a double IF conversion method.

It is a further object of the present invention to provide a TV signal receiving circuit as described above, which converts a desired broadcasting frequency into a predetermined first IF, converts again the first IF into an IF of the conventional TV system, thereby making an image frequency not influential within the TV band and promoting an image rejection characteristic.

It is a further object of the present invention to provide a TV signal receiving circuit which can form respective converting portions with an integrated circuit using a semiconductor device such as GaAs of a high frequency characteristic by converting a broadcasting frequency into a very high frequency of a predetermined frequency band.

To accomplish the objects, TV signal receiving system according to the present invention comprises the steps of:

selecting a desired channel frequency from a TV RF input signal;

converting the selected frequency into an ultra high frequency of 2 GHz;

maintaining the converted signal component; and converting again the signal into an IF of 45 MHz.

Furthermore, to accomplished the objects, the present invention comprises:

a first converting portion for tracking a desired channel frequency from a TV RF signal and converting the frequency into a first IF of 2 GHz;

a band-pass filter of the 2 GHz IF for filtering only the first IF frequency signal from the first converting portion; and a second converting portion for converting the filtered first IF into an IF of 45 MHz of the conventional TV IF.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PRESENT INVENTION

Figure 1:
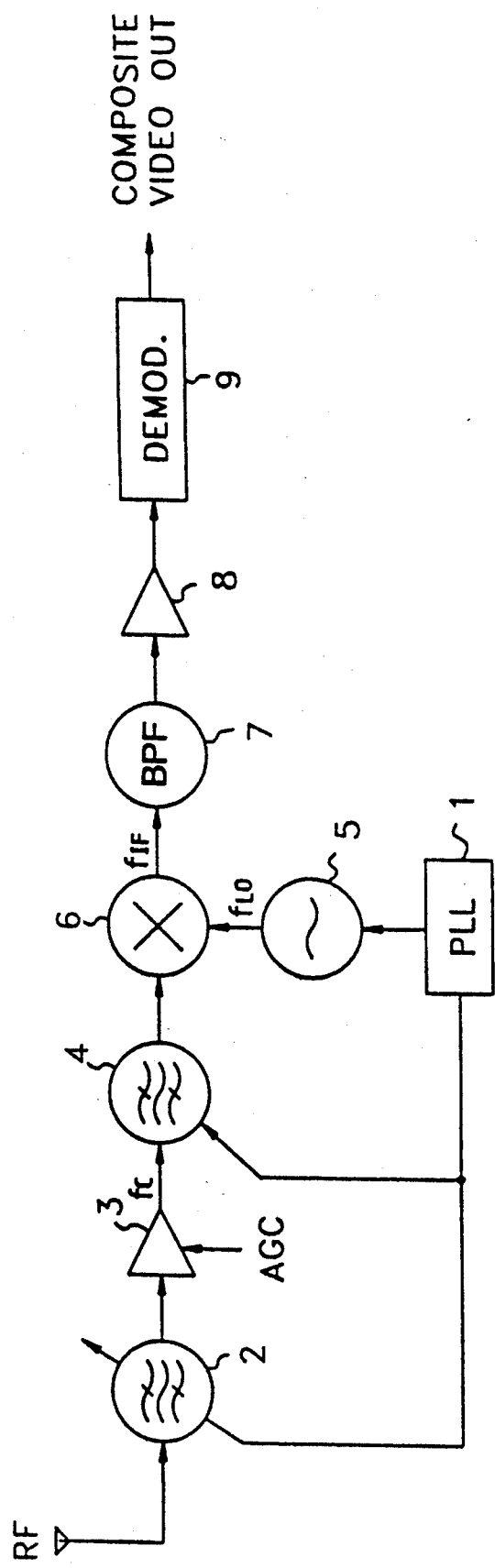
FIG. 1 shows a conventional TV signal receiving circuit.
Figure 2:
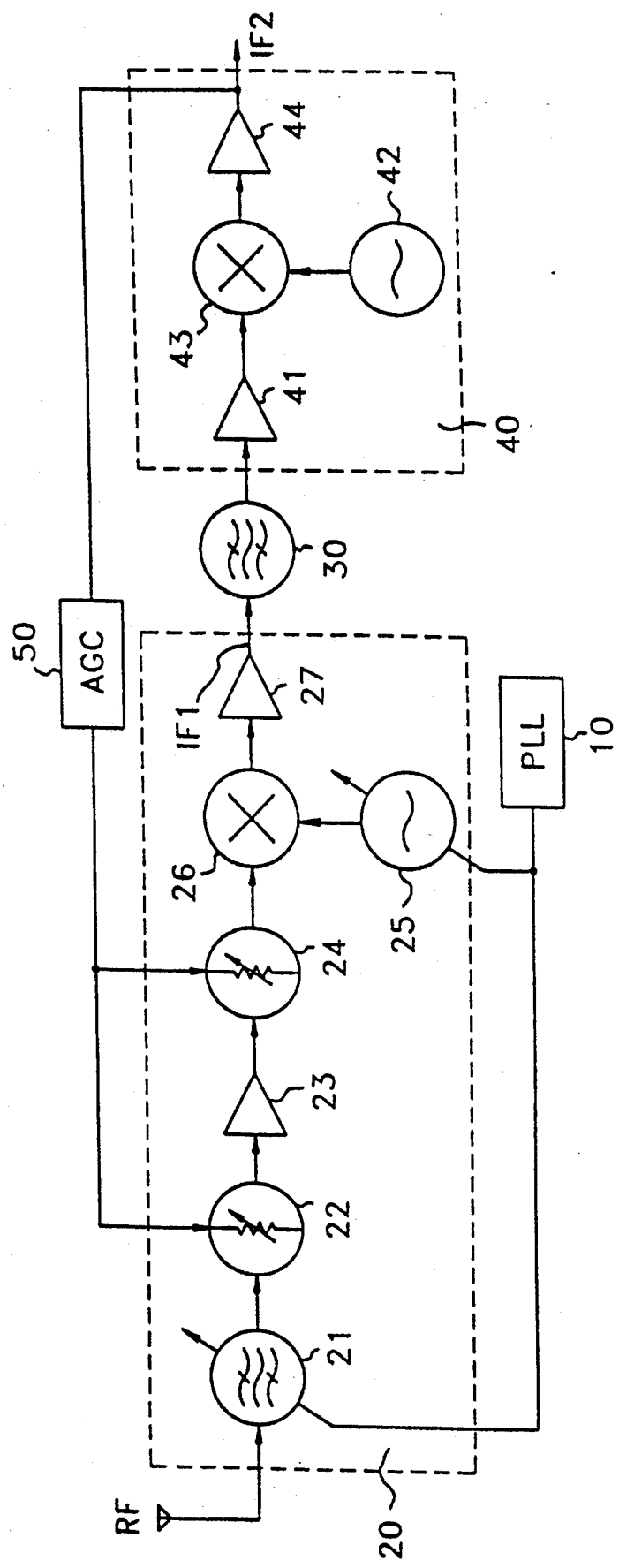
FIG. 2 shows an embodiment of a TV signal receiving circuit according to the present invention.

Referring to FIG. 2 showing a TV signal receiving circuit according to the present invention, TV signal receiving system comprises a phase locked loop 10 (hereinafter referred to as PLL), a first converter 20 which may be called as an up-conversion portion for tracking a desired channel frequency from a TV RF signal and converting the frequency into a 2 GHz first IF, a band pass filter 30 of the 2 GHz IF for filtering only the first IF signal from the first converter 20, a second converter 40 which may be called as a down-conversion portion for converting the filtered first IF into the conventional TV IF of 45 MHz to output, and an automatic gain control (hereinafter referred to as AGC) circuit 50 for generating an AGC signal in accordance with the output of an output terminal.

The first converter 20 comprises an input control filter 21 for receiving an RF signal in 50 to 900 MHz from an antenna and filtering the RF signal in a certain band according to a predetermined frequency generated from the PLL 10, a first AGC variable attenuator 22 for attenuating the output of the input control filter 21 according to the output gain control signal from the AGC circuit 50, an RF amplifier 23 for amplifying the output RF signal of the first AGC variable attenuator 22, a second AGC attenuator 24 for attenuating the output of RF amplifier 23 according to the output gain control signal from the AGC circuit 50, a voltage controlled oscillator (hereinafter referred to VCO) 25 for generating a signal in 2050 to 2900 MHz according to the output of the PLL 10, an RF mixer 26 for mixing the outputs of the second AGC variable attenuator 24 and VCO 25 and generating an IF, and a first IF amplifier 27 for amplifying the output of the IF signal of the RF mixer 26.

Meanwhile, the second converter 40 comprises a second IF amplifier 41 for amplifying the output of the band pass filter 30, a mixer 43 for mixing the outputs of the second IF amplifier 41 and local oscillator 42 for generating a fixed 2045 MHz signal, and a third IF amplifier 44 for amplifying the output of the mixer 43.

That is, the receiving system of the present invention adopts a double-conversion system.

The operation of the system constructed as above will be described below.

When frequency fc of a signal from an antenna is in 50 to 900 MHz, the output IF $f_{IF1}$ of the first converter 20 is 2 GHz (or 2000 MHz), and the frequency $f_{IF2}$ generated from the second converter 40 is 45 MHz, the circuit in FIG. 2 has the following relationships.

$$f_{IM1} = fc \pm 2f_{IF1} = fc \pm 2 \times 2000 = fc \pm 4000 (MHz) \quad (1)$$

$$f_{IM2} = f_{IF1} \pm 2f_{IF2} = 2000 \pm 2 \times 45 = 1910/2090 (MHz) \quad (2)$$

Accordingly, image components generated by IF frequency in respective converters 20 and 40 are as follows.

An image component of 2 GHz $f_{IF1}$ or the first IF, in the converter 20 is $fc \pm 4$ (GHz) and the fc is within 50 to 900 MHz. Therefore, the fc is not affected by the image frequency.

An image component of 45 MHz $f_{IF2}$ or the second IF in the second converter 40, exists beyond the TV frequency band, too. Therefore, the fc is not affected by the image component, thereby improving image rejection characteristic.

The double-conversion tuning system having the first and second converters 20 and 40, to attain a more integrated circuit, uses material having an excellent high frequency characteristic such as GaAs, thereby enabling to replace the conventional tuner with two chips.

As illustrated in FIG. 2, the system of the present invention includes the first converter 20 which tracks a desired channel frequency from a TV RF signal and converts the frequency into 2 GHz frequency or the first IF, and the second converter 40 which converts the first IF signal filtered in band-pass filter 30 into the 45 MHz TV IF or the second IF and outputs it. The TV signal in 50 MHz to 900 MHz fed into an antenna passes through input control filter 21 in which a certain channel signal is selected by PLL circuit 10.

The selected channel TV signal is gain-controlled if necessary by first attenuator 22 driven according to the output of AGC circuit 50, then passes through RF amplifier 23 in which a low signal or a certain level signal is amplified to apply through second AGC attenuator 24 to RF mixer 26. In RF mixer 26, the signal supplied from AGC attenuator 24 and a signal which is voltage-controlled by PLL circuit 10 and oscillated into the frequency corresponding to the selected broadcasting channel in VCO 25, are mixed to generate the mixed 2 GHz first IF. If an input broadcasting frequency is fc, and $f_{IF1} = 2$ GHz, then the oscillated frequency of VCO 25 should be fvco=fc+2 GHz. Therefore, as fc is a signal in 50 to 900 MHz TV RF bandwidth, the oscillated frequency of VCO 25 for second-converting is a frequency covering the range fvco=2050 to 20900 MHz.

The first IF signal converted into 2 GHz frequency produced from the first converter 20 passes through the first IF amplifier 27 in which the IF signal compensates the conversion loss in RF mixer 26 and obtains a proper gain. Then, the 2 GHz IF signal passes through band pass filter 30 of 2 GHz IF signal passes through band pass filter 30 of 2 GHz IF in order to remove signal components exept for that of the TV channel bandwidth ($\pm 2$ CH). The 2 GHz IF signal which passed through IF band pass filter 30 is applied to the second converter 40 to convert into 45 MHz IF2, that is, the IF of the conventional TV system. The input IF signal IF1 in the second converter is applied to mixer 43 via the second IF amplifier 41.

Since the signal applied to the mixer 43 is a 2 GHz first IF signal and the output of the mixer 43 should be 45 MHz, an oscillated frequency in the second converter 40 is obtained from VCO 42 and fixed at 2045 MHz. That is, VCO 42 is an oscillator with a fixed 2045 MHz frequency.

The 45 MHz IF signal IF2 obtained from the second conversion is a final output of the present invention, and the signal is applied to an IF demodulator to generate a final reference band signal.

As described above in detail, after first-converting an image and IF components of the conventional TV tuning system into an ultra high frequency, the present invention need a high-frequency device to acquire a final 45 MHz IF by second-conversion. Then, the present invention is advantageous in that TV tuner can be constructed with IC devices since there is no difficulties in simplifying circuits by using GaAs.

What is claimed is:

1. A television signal receiving tuner, comprising:

first filter means coupled to receive incoming radio frequency signals and responsive to a phase-lock loop circuit, for filtering said incoming radio frequency signals at a first predetermined bandwidth to provide a first filtered frequency signal;

first variable attenuator means for attenuating said first filtered signal in accordance with an automatic gain controlled voltage signal generated by an automatic gain controller to provide a first attenuated frequency signal;

first amplifier means for amplifying said first attenuated signal to provide an amplified frequency signal;

second variable attenuator means for attenuating said amplified frequency signal in accordance with said automatic gain controlled voltage signal generated by said automatic gain controller to provide a second attenuated frequency signal;

voltage-controlled oscillator means responsive to said phase-lock loop circuit, for providing a first local oscillator frequency signal;

first mixer means for converting said second attenuated frequency signal into a first intermediate frequency signal having a frequency approximately of 2 GHz by subtracting said amplified frequency signal from said first local oscillator frequency signal;

second amplifier means for amplifying said first intermediate frequency signal to provide a first amplified intermediate frequency signal;

second filter means for bandpass filtering said first amplified intermediate frequency signal at a second predetermined bandwidth to provide a second filtered frequency signal;

third amplifier means for amplifying said second filtered frequency signal to provide a second amplified intermediate frequency signal;

second mixer means responsive to a local oscillator generating a second local oscillator frequency signal, for converting said second amplified intermediate frequency signal into a second intermediate frequency signal by subtracting said second amplified intermediate frequency signal from said second local oscillator frequency signal;

fourth amplifier means for amplifying said second intermediate frequency signal at a selected level to provide a final tuned signal, wherein said final tuned signal feeds back to control said automatic gain controlled voltage signal by said automatic gain controller.

2. The television signal receiving tuner as claimed in claim 1, wherein said incoming radio frequency signals have frequencies in a range of 50 to 900 MHz, said voltage controlled oscillator having a frequency range of 2050 to 2900 MHz and said local oscillator having a frequency range of 2045 MHz.

3. A method for minimizing noise interference for a television receiver, comprising the steps of:

receiving incoming radio frequency signal, and filtering said incoming radio frequency signals at a first predetermined bandwidth to provide a first filtered frequency signal synchronized with a phase-locked reference signal;

attenuating said first filtered frequency signal in accordance with an automatic gain controlled voltage to provide a first attenuated frequency signal;

amplifying said first attenuated signal to provide an amplified frequency signal;

attenuating said amplified frequency signal in accordance with said automatic gain controlled voltage to provide a second attenuated frequency signal;

receiving a first local oscillator frequency signal synchronized with said phase-locked reference signal;

converting said second attenuated frequency signal into a first intermediate frequency signal having a frequency of approximately 2 GHz by subtracting said amplified frequency signal from said first local oscillator frequency signal;

amplifying said first intermediate frequency signal to provide a first amplified intermediate frequency signal;

bandpass filtering said first amplified intermediate frequency signal at a second predetermined bandwidth to provide a second filtered frequency signal;

amplifying said second filtered frequency signal to provide a second amplified intermediate frequency signal;

receiving a second local oscillator frequency;

converting said second amplified intermediate frequency signal into a second intermediate frequency signal by subtracting said second amplified intermediate frequency signal from said second local oscillator frequency signal; and amplifying said second intermediate frequency signal at a selected level to provide a tuned signal, and applying said tuned signal to control gains of said automatic gain controlled voltage.

4. The method for minimizing noise interference as claimed in claim 3, wherein said incoming radio frequency signals have frequencies in a range of 50 to 900 MHz.

5. The method for minimizing noise interference as claimed in claim 3, wherein said first local oscillator frequency signal has frequencies over a range from approximately 2050 to 2900 MHz and said second local oscillator frequency signal has a frequency of 2045 MHz.

* * * * *

UNITED STATES PATENT AND TRADEMARK OFFICE
CERTIFICATE OF CORRECTION

PATENT NO. : 5,200,826
DATED : 6 April 1993
INVENTOR(S) : Chang-Yeol SEONG

It is certified that error appears in the above-identified patent and that said Letters Patent is hereby corrected as shown below:

Title page, item [54], and col. 1, line 1 delete "TV SIGNAL RECEIVING"

Col. 2, line 54, change "accomplished" to --accomplish--

Signed and Sealed this

Twenty-second Day of March, 1994

Attest:

BRUCE LEHMAN

Attesting Officer

Commissioner of Patents and Trademarks